(12) United States Patent
Kweon et al.

(10) Patent No.: US 12,721,223 B2
(45) Date of Patent: Aug. 25, 2026

(54) SEMICONDUCTOR PACKAGE AND METHOD OF FABRICATING THE SAME

(71) Applicant: Samsung Electronics Co., Ltd., Suwon-si (KR)

(72) Inventors: Jun Yun Kweon, Suwon-si (KR); Yeong Beom Ko, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 499 days.

(21) Appl. No.: 18/301,706

(22) Filed: Apr. 17, 2023

(65) Prior Publication Data

US 2024/0047425 A1 Feb. 8, 2024

(30) Foreign Application Priority Data

Aug. 8, 2022 (KR) ........................ 10-2022-0098374

(51) Int. Cl.

| | |
|---|---|
| ***H10B 80/00*** | (2026.01) |
| ***H10W 90/00*** | (2026.01) |
| ***H10W 95/00*** | (2026.01) |
| *H10W 80/00* | (2026.01) |
| *H10W 90/20* | (2026.01) |

(52) U.S. Cl.

CPC ............ *H10W 90/00* (2026.01); *H10B 80/00* (2023.02); *H10W 95/00* (2026.01); *H10W 80/312* (2026.01); *H10W 80/327* (2026.01); *H10W 90/297* (2026.01); *H10W 90/792* (2026.01)

(58) Field of Classification Search

CPC ..... H01L 25/0657; H01L 25/18; H01L 24/08; H10B 80/00; H10W 20/0245; H10W 20/0249; H10W 74/117

See application file for complete search history.

(56) References Cited

U.S. PATENT DOCUMENTS 8,263,439 B2 9/2012 Marimuthu et al.
9,258,922 B2 2/2016 Chen et al.
9,543,276 B2 1/2017 Jee et al.
(Continued)

FOREIGN PATENT DOCUMENTS

KR 20160122769 A 10/2016
KR 10-2020-0047841 A 5/2020

*Primary Examiner* — Dale E Page
*Assistant Examiner* — Wilner Jean Baptiste
(74) *Attorney, Agent, or Firm* — Wolf, Greenfield & Sacks, P.C.

(57) ABSTRACT

A semiconductor package includes a first semiconductor chip, first and second dummy chips below the first semiconductor chip, a second semiconductor chip between the first and second dummy chips, a first through via penetrating the second semiconductor chip and electrically connected to the first semiconductor chip, second and third through vias penetrating the first and second dummy chips, respectively, and each electrically connected to the first semiconductor chip, a first bonding pad bonding the first semiconductor chip to the second semiconductor chip, a second bonding pad bonding the first semiconductor chip to the first dummy chip, a third bonding pad bonding the first semiconductor chip to the second dummy chip, and a first insulating layer below the second semiconductor chip and below the first and second dummy chips with each of the first, second, and third through vias penetrating the first insulating layer.

16 Claims, 12 Drawing Sheets

(56) References Cited

U.S. PATENT DOCUMENTS

| | | | | |
|---|---|---|---|---|
| 9,875,911 | B2 | 1/2018 | Pagaila et al. | |
| 10,109,567 | B2 | 10/2018 | Lin | |
| 10,861,808 | B2 | 12/2020 | Chen et al. | |
| 12,476,189 | B2 * | 11/2025 | Huang | H10W 20/20 |
| 2011/0215470 | A1 * | 9/2011 | Chen | H01L 23/5385 257/773 |
| 2021/0296284 | A1 * | 9/2021 | Sharangpani | H10W 90/00 |
| 2021/0407941 | A1 * | 12/2021 | Haba | H01L 25/0655 |

* cited by examiner

SEMICONDUCTOR PACKAGE AND METHOD OF FABRICATING THE SAME

CROSS-REFERENCE TO RELATED APPLICATION

This application claims priority from Korean Patent Application No. 10-2022-0098374, filed on Aug. 8, 2022 in the Korean Intellectual Property Office, and all the benefits accruing therefrom under 35 U.S.C. 119, the contents of which are herein incorporated by reference in their entirety.

BACKGROUND

The present disclosure relates to a semiconductor package and a method of fabricating the same.

A semiconductor package is being developed to efficiently fabricate semiconductor chips having more various functions and high reliability. In addition, a stacked semiconductor package with a plurality of semiconductor chips stacked therein has been proposed to mount more semiconductor chips in the same area.

Such a semiconductor package may have a structure in which different types of semiconductor chips are vertically stacked. Thus, a semiconductor package in which semiconductor chips including a through silicon via (TSV) are vertically stacked is being developed to implement the stacked structure.

SUMMARY

Aspects of the present disclosure provide a semiconductor package capable of improving product reliability.

Aspects of the present disclosure also provide a method of fabricating a semiconductor package which can improve the efficiency of a fabrication process.

However, aspects of the present disclosure are not restricted to those set forth herein. The above and other aspects of the present disclosure will become more apparent to one of ordinary skill in the art to which the present disclosure pertains by referencing the description of the present disclosure below.

According to an aspect of the present disclosure, there is provided a semiconductor package including a first semiconductor chip, first and second dummy chips below the first semiconductor chip, a second semiconductor chip between the first and second dummy chips, a first through via penetrating the second semiconductor chip and electrically connected to the first semiconductor chip, second and third through vias penetrating the first and second dummy chips, respectively, and each electrically connected to the first semiconductor chip, a first bonding pad bonding the first semiconductor chip to the second semiconductor chip, a second bonding pad bonding the first semiconductor chip to the first dummy chip, a third bonding pad bonding the first semiconductor chip to the second dummy chip, and a first insulating layer below the second semiconductor chip and below the first and second dummy chips with each of the first, second, and third through vias penetrating the first insulating layer.

According to another aspect of the present disclosure, there is provided a semiconductor package including a first semiconductor chip, first and second dummy chips below the first semiconductor chip, a second semiconductor chip between the first and second dummy chips, a first through via extending into or penetrating the second semiconductor chip and electrically connected to the first semiconductor chip, second and third through vias extending into or penetrating the first and second dummy chips, respectively, and each electrically connected to the first semiconductor chip, a first bonding pad bonding the first semiconductor chip to the second semiconductor chip, a second bonding pad bonding the first semiconductor chip to the first dummy chip, and a third bonding pad bonding the first semiconductor chip to the second dummy chip, wherein interfaces between the second semiconductor chip and each of the first and second dummy chips are free of an insulating material.

According to still another aspect of the present disclosure, there is provided a method of fabricating a semiconductor package including providing a first semiconductor chip having a first through via formed therein, a first dummy chip having a second through via formed therein, and a second dummy chip having a third through via formed therein, bonding the first semiconductor chip to a second semiconductor chip through a first bonding pad, bonding the first dummy chip to the second semiconductor chip through a second bonding pad, and bonding the second dummy chip to the second semiconductor chip through a third bonding pad, grinding upper surfaces of the first semiconductor chip, the first dummy chip, and the second dummy chip to expose portions of each of the first, second, and third through vias, forming a first insulating layer on the first semiconductor chip, the first dummy chip, and the second dummy chip, positioning upper surfaces of the first, second, and third through vias to be coplanar with an upper surface of the first insulating layer, forming, on the first insulating layer, a substrate including first, second, and third connection pads and a second insulating layer, and forming a plurality of connection terminals on the substrate.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail example embodiments thereof with reference to the attached drawings, in which:

FIG. 1 is a schematic perspective view of a semiconductor package according to some embodiments;

FIG. 2 is a schematic plan view of a semiconductor package according to some embodiments;

FIGS. 9 to 12 are views for describing a method of fabricating a semiconductor package according to some embodiments.

DETAILED DESCRIPTION

Hereinafter, a semiconductor package according to example embodiments will be described with reference to FIGS. 1 to 12.

Figure 1:
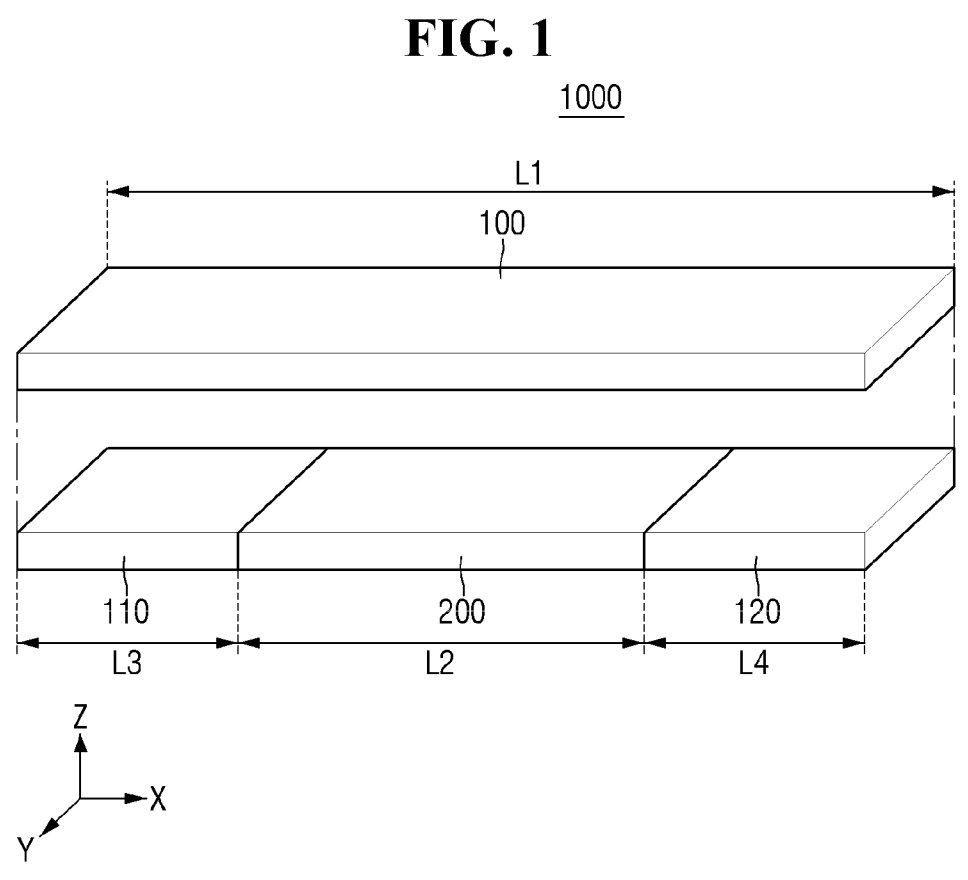
Figure 2:
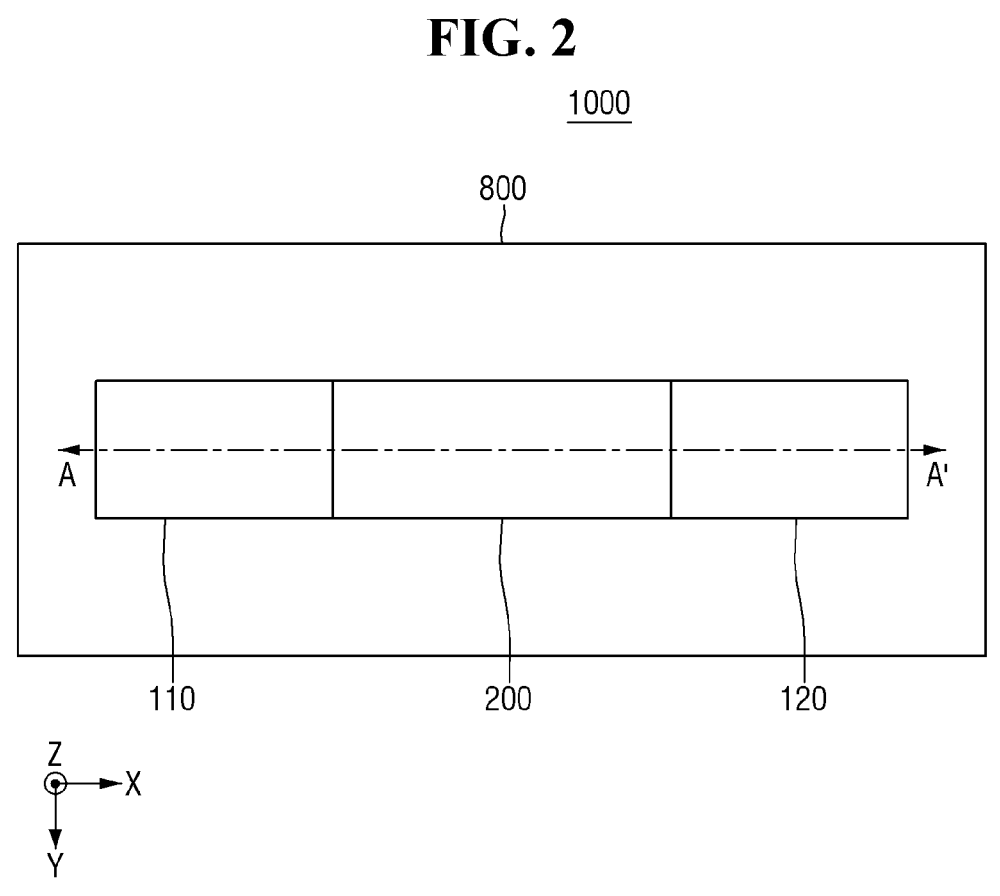
Figure 3:
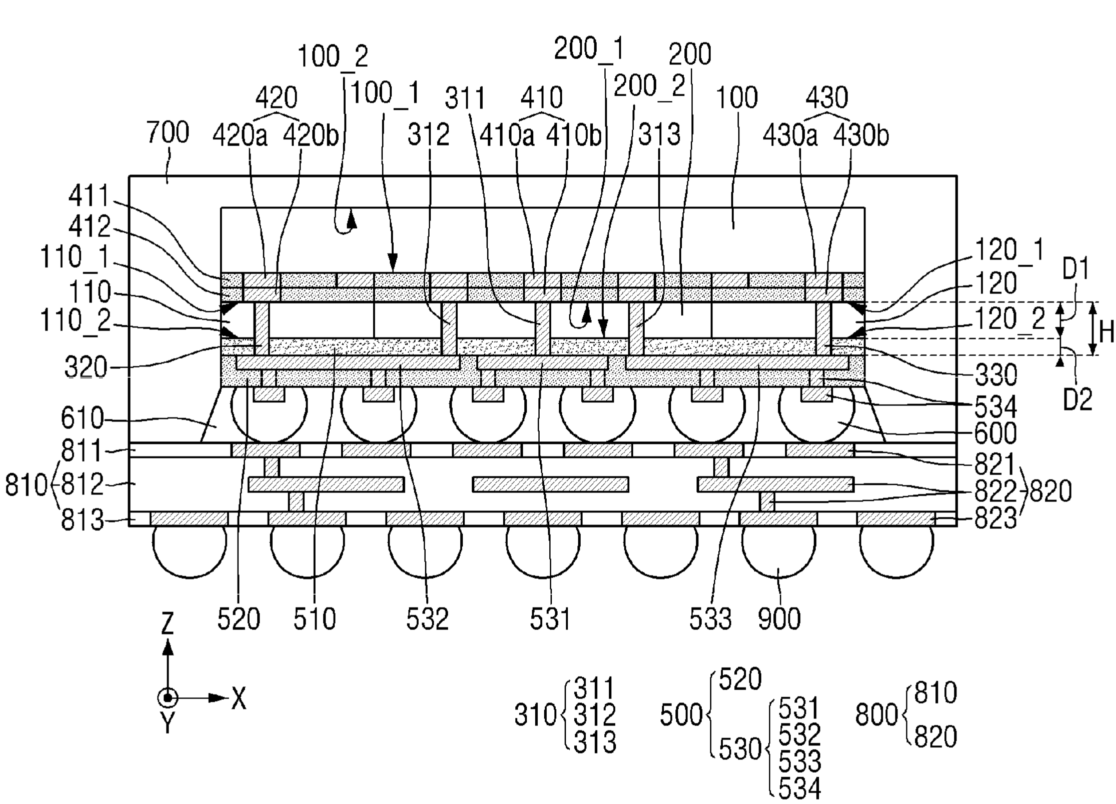
FIG. 3 is a cross-sectional view taken along line A-A' of FIG. 2.

FIG. 1 is a schematic perspective view of a semiconductor package according to some embodiments. FIG. 2 is a schematic plan view of a semiconductor package according to some embodiments. FIG. 3 is a cross-sectional view taken along line A-A' of FIG. 2.

Referring to FIGS. 1 to 3, a semiconductor package 1000 according to some embodiments may include a first semiconductor chip 100, a first dummy chip 110, a second dummy chip 120, a second semiconductor chip 200, a first through via 310, a second through via 320, a third through via 330, a first bonding pad 410, a second bonding pad 420, a third bonding pad 430, a first insulating layer 510, a first substrate 500, a first connection terminal 600, an underfill material 610, a mold layer 700, a second substrate 800, and a second connection terminal 900.

The first semiconductor chip 100 may include a first surface 100_1 and a second surface 100_2 opposing each other. The first surface 100_1 of the first semiconductor chip 100 may be a lower surface and the second surface 100_2 may be an upper surface. In a plan view, the first semiconductor chip 100 may extend in a first direction X and a second direction Y that intersects or is perpendicular to the first direction X.

Although not specifically illustrated, the first semiconductor chip 100 and the second semiconductor chip 200 to be described below may each include a substrate layer and a device layer. The substrate layer may include a semiconductor substrate, a plurality of conductive regions formed in the semiconductor substrate, and isolation regions on one side of the conductive regions. The semiconductor substrate may be a semiconductor wafer. The semiconductor substrate may include a semiconductor element such as silicon or germanium (Ge), or a compound semiconductor such as silicon carbide (SiC), gallium arsenide (GaAs), indium arsenide (InAs), or indium phosphide (InP). The conductive region may be, for example, a well doped with impurities or a structure doped with impurities. The isolation region may be a device isolation structure having a shallow trench isolation (STI) structure, and may include silicon oxide.

The first semiconductor chip 100 may include a logic chip such as a central processing unit (CPU), a graphic processing unit (GPU), a field-programmable gate array (FPGA), a digital signal processor (DSP), an image signal processor (ISP), an encryption processor, a micro-processor, a microcontroller, an analog-to-digital converter, an application-specific IC (ASIC), or the like, but is not limited thereto.

The first dummy chip 110 may include a first surface 110_1 and a second surface 110_2 opposing each other. The first surface 110_1 of the first dummy chip 110 may be an upper surface and the second surface 110_2 may be a lower surface. The second dummy chip 120 may include a first surface 120_1 and a second surface 120_2 opposing each other. The first surface 120_1 of the second dummy chip 120 may be an upper surface and the second surface 120_2 may be a lower surface.

Each of the first dummy chip 110 and the second dummy chip 120 is disposed below the first semiconductor chip 100. For example, the first dummy chip 110 and the second dummy chip 120 may be disposed below the first semiconductor chip 100 in a third direction Z that intersects or is perpendicular to each of the first and second directions X and Y.

Accordingly, the first surface 100_1 of the first semiconductor chip 100 and the first surface 110_1 of the first dummy chip 110 may oppose or face each other. The first surface 100_1 of the first semiconductor chip 100 and the first surface 120_1 of the second dummy chip 120 may oppose or face each other.

The first dummy chip 110 and the second dummy chip 120 may each be a semiconductor substrate that does not include a circuit layer. For example, the first dummy chip 110 and the second dummy chip 120 may each be a silicon substrate, a germanium substrate, or a silicon germanium substrate. For example, the first dummy chip 110 and the second dummy chip 120 may each be a bulk silicon substrate.

The second semiconductor chip 200 may be disposed between the first and second dummy chips 110 and 120. For example, the second semiconductor chip 200 may be disposed between the first and second dummy chips 110 and 120 with respect to the first direction X.

The second semiconductor chip 200 may include a first surface 200_1 and a second surface 200_2 opposing each other. The first surface 200_1 of the second semiconductor chip 200 may be an upper surface and the second surface 200_2 may be a lower surface.

Accordingly, one side surface of the second semiconductor chip 200 (e.g., a first side surface of the second semiconductor chip 200) and a side surface of the first dummy chip 110 may be in contact with each other. In addition, the other side surface opposing the one side surface of the second semiconductor chip 200 (e.g., a second, opposite side surface of the second semiconductor chip 200) may be in contact with a side surface of the second dummy chip 120. That is, an insulating material may not be interposed between the second semiconductor chip 200 and the first dummy chip 110 and between the second semiconductor chip 200 and the second dummy chip 120. In other words, interfaces between the second semiconductor chip 200 and each of the first and second dummy chips 110 and 120 may be devoid or free of an insulating material.

Also, with respect to the first and second directions X and Y, the size of the first semiconductor chip 100 may be greater than the size of the second semiconductor chip 200. For example, with respect to the first direction X, a length or width L1 of the first semiconductor chip 100 may be longer or wider than a length or width L2 of the second semiconductor chip 200.

Accordingly, a side surface of the first dummy chip 110 and a side surface of the second dummy chip 120 may each be positioned coplanar with the first semiconductor chip 100 in the third direction Z. That is, the side surface of the first dummy chip 110 and the side surface of the second dummy chip 120 may each be aligned to the first semiconductor chip 100 in the third direction Z.

For example, with respect to the first direction X, the length or width L1 of the first semiconductor chip 100 may be equal to the sum of the length or width L2 of the second semiconductor chip 200, a length or width L3 of the first dummy chip 110, and a length or width L4 of the second dummy chip 120.

In this embodiment, the first and second dummy chips 110 and 120 formed on both sides of the second semiconductor chip 200 may be formed as silicon (Si) chips. Accordingly, heat of the semiconductor package 1000 may be more easily dissipated as compared to the case in which oxide layers are formed on both sides of the second semiconductor chip 200.

For example, the second semiconductor chip 200 may include a non-volatile memory chip such as a static random access memory (SRAM), a dynamic random access memory (DRAM), or the like, and a non-volatile memory, such as a phase changing random access memory (PRAM), a magnetic random access memory (MRAM), a resistive random access memory (RRAM), a flash memory, or the like. In this embodiment, the first and second semiconductor chips 100 and 200 may include different types of semiconductor chips.

The first bonding pad 410 may be positioned between the first semiconductor chip 100 and the second semiconductor chip 200 to bond the first semiconductor chip 100 and the second semiconductor chip 200 to each other. Specifically, the first bonding pad 410 may include a first upper bonding pad 410*a* disposed on the lower surface 100_1 of the first semiconductor chip 100 and a first lower bonding pad 410*b* disposed on the upper surface 200_1 of the second semiconductor chip 200.

The second bonding pad 420 may be positioned between the first semiconductor chip 100 and the first dummy chip 110 to bond the first semiconductor chip 100 and the first dummy chip 110 to each other. Specifically, the second bonding pad 420 may include a second upper bonding pad 420*a* disposed on the lower surface 100_1 of the first semiconductor chip 100 and a second lower bonding pad 420*b* disposed on the upper surface 110_1 of the first dummy chip 110.

The third bonding pad 430 may be positioned between the first semiconductor chip 100 and the second dummy chip 120 to bond the first semiconductor chip 100 and the second dummy chip 120 to each other. Specifically, the third bonding pad 430 may include a third upper bonding pad 430*a* disposed on the lower surface 100_1 of the first semiconductor chip 100 and a third lower bonding pad 430*b* disposed on the upper surface 120_1 of the second dummy chip 120.

A first passivation layer 411 may be disposed on the first surface 100_1 of the first semiconductor chip 100, and a second passivation layer 412 may be disposed on the first surfaces 110_1, 120_1 and 200_1 of the each of the first and second dummy chips 110 and 120 and the second semiconductor chip 200. The first and second passivation layers 411 and 412 and the first to third bonding pads may be formed at least in part through a back-end-of-line (BEOL) process.

At least a portion of the first upper bonding pad 410*a* may be disposed in the first passivation layer 411, and at least a portion of the first lower bonding pad 410*b* may be disposed in the second passivation layer 412. At least a portion of the second upper bonding pad 420*a* may be disposed in the first passivation layer 411, and at least a portion of the second lower bonding pad 420*b* may be disposed in the second passivation layer 412. At least a portion of the third upper bonding pad 430*a* may be disposed in the first passivation layer 411, and at least a portion of the third lower bonding pad 430*b* may be disposed in the second passivation layer 412.

The first to third bonding pads 410, 420, and 430 may each include a conductive material such as metal. For example, the first to third bonding pads 410, 420, and 430 may include, but are not limited to, at least one metal or metal alloy selected from among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn) and carbon (C).

The first passivation layer 411 and the second passivation layer 412 may each include an insulating material. For example, the first passivation layer 411 and the second passivation layer 412 may each include, but are not limited to, at least one of silicon oxide, silicon nitride, or silicon carbonitride.

The first upper bonding pad 410*a* and the first lower bonding pad 410*b* may be directly bonded to each other, and the second upper bonding pad 420*a* and the second lower bonding pad 420*b* may be directly bonded to each other.

Also, the third upper bonding pad 430*a* and the third lower bonding pad 430*b* may be directly bonded to each other. For example, each pair of the upper bonding pad and the lower bonding pad opposing each other may form copper (Cu)-copper (Cu) bonding.

As a result, the first semiconductor chip 100 and the second semiconductor chip 200 may be bonded to each other, the first semiconductor chip 100 and the first dummy chip 110 may be bonded to each other, and the first semiconductor chip 100 and the second dummy chip 120 may be bonded to each other. That is, different types of semiconductor chips may be bonded to each other through the bonding pads described above.

The first through via 310 may include first through vias 311, 312, and 313.

The first through via 311 may penetrate the second semiconductor chip 200 in the third direction Z and be electrically connected to the first semiconductor chip 100. The first through via 311 may be electrically connected to the first semiconductor chip 100 through the first upper bonding pad 410*a* and the first lower bonding pad 410*b*. The first through via 311 may be in contact with the first lower bonding pad 410*b* and thus electrically connected to the first semiconductor chip 100 through the first lower bonding pad 410*b*.

The first through via 312 may be connected to a second connection pad 532, which will be described below, and electrically connected to the second through via 320. The first through via 312 may be electrically connected to the first semiconductor chip 100 through the second connection pad 532, the second through via 320, the second lower bonding pad 420*b*, and the second upper bonding pad 420*a*.

The first through via 313 may be connected to a third connection pad 533, which will be described below, and electrically connected to the third through via 330. The first through via 313 may be electrically connected to the first semiconductor chip 100 through the third connection pad 533, the third through via 330, the third lower bonding pad 430*b*, and the third upper bonding pad 430*a*.

The first through via 311 may be positioned between the first lower bonding pad 410*b* and the first connection pad 531 to penetrate the second semiconductor chip 200 and the first insulating layer 510 which will be described below. The first through via 311 may be electrically connected to at least one of a plurality of first connection terminals 600, which will be described below, through the first connection pad 531.

The first through via 312 may be positioned between the first lower bonding pad 410*b* and the second connection pad 532 to penetrate the second semiconductor chip 200 and the first insulating layer 510. The first through via 312 may be electrically connected to one of the plurality of first connection terminals 600, which will be described below, through the second connection pad 532.

The first through via 313 may be positioned between the first lower bonding pad 410*b* and the third connection pad 533 to penetrate the second semiconductor chip 200 and the first insulating layer 510. The first through via 313 may be electrically connected to at least one of the plurality of first connection terminals 600, which will be described below, through the third connection pad 533.

Although one first through via 311, one first through via 312, and one first through via 313 are illustrated in FIG. 3, the present disclosure is not limited thereto.

The second through via 320 may penetrate the first dummy chip 110 in the third direction Z and be electrically connected to the first semiconductor chip 100. The second through via 320 may be electrically connected to the first semiconductor chip 100 through the second upper bonding pad 420*a* and the second lower bonding pad 420*b*. The second through via 320 may be in contact with the second lower bonding pad 420*b* and thus electrically connected to the first semiconductor chip 100 through the second upper bonding pad 420*a*.

The third through via 330 may penetrate the second dummy chip 120 in the third direction Z and be electrically connected to the first semiconductor chip 100. The third through via 330 may be electrically connected to the first semiconductor chip 100 through the third upper bonding pad 430*a* and the third lower bonding pad 430*b*. The third through via 330 may be in contact with the third lower bonding pad 430*b* and thus electrically connected to the first semiconductor chip 100 through the third upper bonding pad 430*a*.

Although one second through via 320 and one third through via 330 are illustrated in FIG. 2, the present disclosure is not limited thereto such that a plurality of second through vias 320 and a plurality of third through vias 330 may be formed.

The second through via 320 may be positioned between the second lower bonding pad 420*b* and the second connection pad 532 and penetrate the first dummy chip 110 and the first insulating layer 510. The second through via 320 may be electrically connected to at least one of the plurality of first connection terminals 600.

The third through via 330 may be positioned between the third lower bonding pad 430*b* and the third connection pad 533 to penetrate the second dummy chip 120 and the first insulating layer 510. The third through via 330 may be electrically connected to at least one of the plurality of first connection terminals 600.

The first to third through vias 310, 320, and 330 may each include a conductive material such as metal. For example, the first to third through vias 310, 320, and 330 may include, but are not limited to, at least one metal or metal alloy selected from among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn) and carbon (C).

The first to third through vias 310, 320, and 330 may be completely filled with a conductive material, or may each be a via in which a conductive material is formed along a wall of a via hole. In addition, the first to third through vias 310, 320, and 330 may include any known shape such as a cylindrical shape, as well as a tapered shape.

At least some of the first to third through vias 310, 320, and 330 may provide an electrical connection path between the first semiconductor chip 100 and the first substrate 500.

The first insulating layer 510 may be disposed below the second semiconductor chip 200 and below the first and second dummy chips 110 and 120. The first insulating layer 510 may be penetrated by each of the first to third through vias 310, 320, and 330. In the third direction Z, a thickness of the first dummy chip 110, a thickness of the second semiconductor chip 200, and a thickness D1 of the second dummy chip 120 may be the same as one another. In the third direction Z, heights H of the first to third through vias 310, 320, and 330 may be the same as one another. The sum of the thickness D2 of the first insulating layer 510 and the thickness D1 of the first dummy chip 120, the sum of the thickness D2 of the first insulating layer 510 and the thickness D1 of the second semiconductor chip 200, and the sum of the thickness D2 of the first insulating layer 510 and the thickness D1 of the second dummy chip 120 may be the same as the heights H of the first to third through vias 310, 320, and 330.

The first insulating layer 510 may include an insulating material. For example, the first insulating layer 510 may include an oxide such as tetra ethyl ortho silicate (TEOS), but is not limited thereto.

The first substrate 500 may include the second insulating layer 520, the first to third connection pads 531, 532, and 533, and a plurality of pads 534. The second insulating layer 520 may be disposed below the first insulating layer 510, and have the first to third connection pads 531, 532, and 533 disposed therein. The first to third connection pads 531, 532, and 533 may be electrically connected to the first connection terminals 600 through the plurality of pads 534.

A material of the second insulating layer 520 is not particularly limited, and may include, for example, a photosensitive insulating material, such as a photosensitive insulating resin. Alternatively, the second insulating layer 520 may include, for example, Ajinomoto Build-up Film (ABF) including a filler and an insulating resin.

The plurality of pads 534 may include a conductive material such as metal. For example, the plurality of pads 534 may include, but are not limited to, at least one metal or metal alloy selected from among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn) and carbon (C).

The first connection terminal 600 may be disposed below the second insulating layer 520. A plurality of first connection terminals 600 may be formed. The first connection terminal 600 may electrically connect the second substrate 800, which will be described below, to the first and second semiconductor chips 100 and 200.

The first connection terminal 600 may be, for example, a solder bump, but is not limited thereto. The first connection terminal 600 may have various shapes, such as a land, a ball, a pin, a pillar, and the like. The number, interval, arrangement form, and the like of the first connection terminals 600 are not limited to those shown, and may, of course, vary depending on the design.

The first connection terminal 600 may include at least one of, for example, tin (Sn), lead (Pb), nickel (Ni), gold (Au), silver (Ag), copper (Cu), or bismuth (Bi), or a combination thereof, but the present disclosure is not limited thereto.

The underfill material 610 may be filled in a space between the first substrate 500 and the second substrate 800 and surround the first connection terminal 600. Although not specifically illustrated, the underfill material 610 may extend to an edge of the first substrate 500 and cover at least a portion of a side surface of the first substrate 500.

The underfill material 610 may include an insulating polymer material, for example, an epoxy resin.

The mold layer 700 may be on the second substrate 800 and cover the first semiconductor chip 100, the second semiconductor chip 200, and the first and second dummy chips 110 and 120. The mold layer 700 may cover at least a portion of the side surface of the first substrate 500, one side surface of the first dummy chip 110, one side surface of the second dummy chip 120, one side surface of each of the first and second passivation layers 411 and 412, and the side surface and upper surface of the second semiconductor chip 200.

The mold layer 700 may include, but is not limited to, an insulating polymeric material such as an epoxy-molding compound (EMC). The mold layer 700 may include a different material from that of the underfill material 610. For example, the underfill material 610 may include an insulating material having fluidity superior to the mold layer 700. Accordingly, the underfill material 610 may be more efficiently filled in a narrow space between the first substrate 500 and the second substrate 800.

The second substrate 800 may be a printed circuit board (PCB). In this case, the PCB may be a multi-layer circuit board having vias and various circuits therein.

The second substrate 800 may include a plurality of insulating layers 810 and a plurality of interconnections 820. The plurality of insulating layers 810 may include a second insulating layer 812, and first and third insulating layers 811 and 813 on the second insulating layer 812.

The second insulating layer 812 may include an insulating material. For example, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, Bismaleimide Triazine (BT), or the like. When the second substrate 800 includes a copper clad laminate (CCL), the second insulating layer 812 may have a structure in which a copper laminate is stacked on one side or both sides of a thermosetting prepreg.

The first and third insulating layers 811 and 813 may be solder resist layers. For example, the first and third insulating layers may include a photo-imagable dielectric (PID) resin to which a photolithography process can be applied, but is not limited thereto.

The plurality of interconnections 820 may include upper pads 821 connected to the first connection terminals 600, lower pads 823 connected to the second connection terminals 900, a plurality of interconnection pads between the upper pad 821 and the lower pad 823 and electrically connecting the upper pad 821 to the lower pad 823, and vias 822 connecting the upper pads 821 and the lower pads 823. At least some upper pads 821 may be disposed in the first insulating layer 811 and at least some lower pads 823 may be disposed in the third insulating layer 813.

The plurality of interconnections 820 may include a conductive material such as metal. For example, the plurality of interconnections 820 may include, but are not limited to, at least one metal or metal alloy selected from among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn) and carbon (C).

Figure 4:
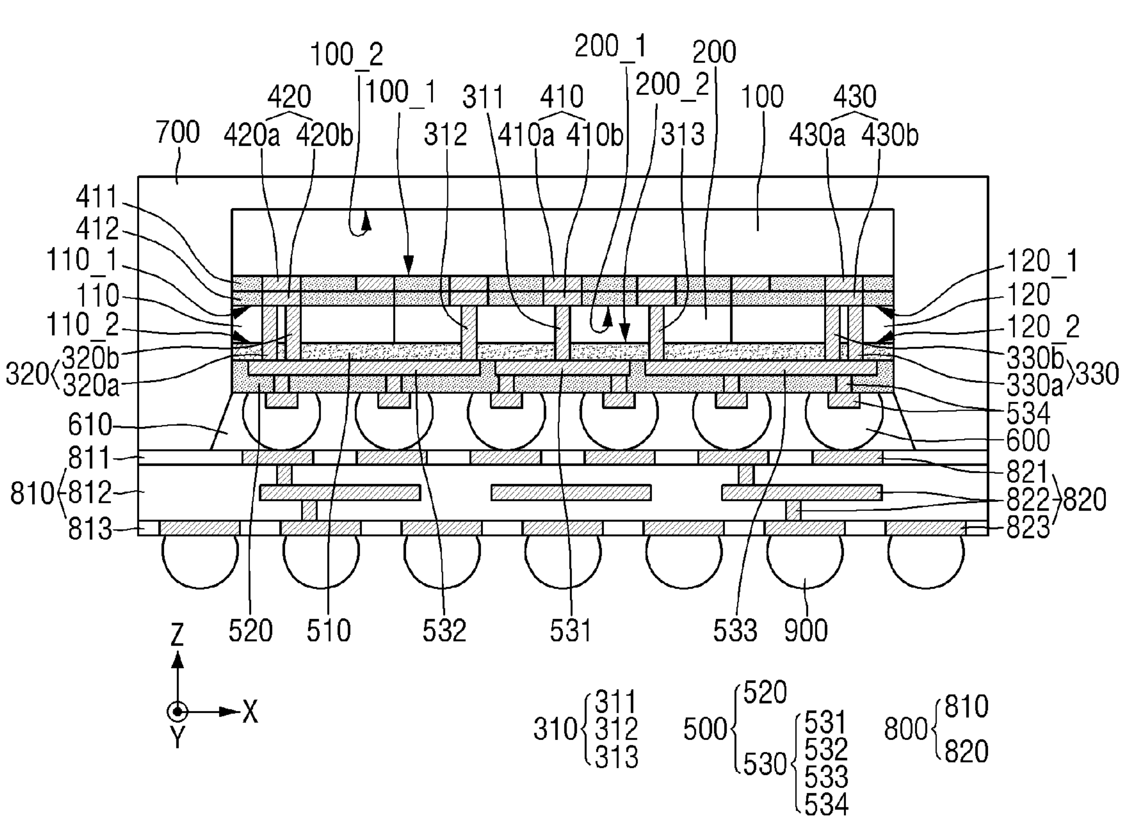
FIG. 4 is a cross-sectional view of a semiconductor package according to some embodiments.

FIG. 4 is a cross-sectional view of a semiconductor package according to some embodiments. For convenience of description, repeated contents of parts described with reference to FIGS. 1 to 3 may be omitted.

Referring to FIG. 4, a plurality of second through vias 320 and a plurality of third through vias 330 may be formed in a semiconductor package 1000A.

For example, the second through vias 320 may include a second through via 320*a* and a second through via 320*b* spaced apart from the second through via 320*a* in the first direction X. The third through vias 330 may include a third through via 330*a* and a third through via 330*b* spaced apart from the third through via 330*a* in the first direction X.

Although two second through vias 320 and two third through vias 330 are illustrated in FIG. 4, the number of the second and third through vias is not limited thereto.

FIGS. 5 to 8 are views for describing a method of fabricating a semiconductor package according to some embodiments. For convenience of description, repeated contents of parts described with reference to FIGS. 1 to 3 may be omitted.

Figure 5:
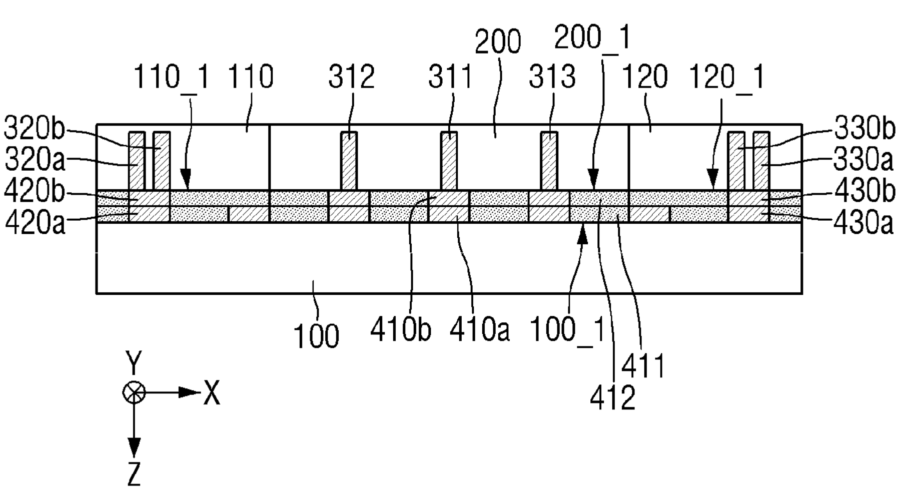
FIGS. 5 to 8 are views for describing a method of fabricating a semiconductor package according to some embodiments.

Referring to FIG. 5, a second semiconductor chip 200, a first dummy chip 110, and a second dummy chip 120 in each of which first to third through vias 310, 320, and 330 are formed may be provided. The second semiconductor chip 200 may have a plurality of first through vias 311, 312, and 313 formed therein, the first dummy chip 110 may have the second through via 320 formed therein, and the second dummy chip 120 may have the third through via 330 formed therein.

A first surface 100_1 of the first semiconductor chip 100 and a first surface 200_1 of the second semiconductor chip 200 may be disposed to oppose or face each other. The first surface 100_1 of the first semiconductor chip 100 and a first surface 110_1 of the first dummy chip 110 may be disposed to oppose or face each other. The first surface 100_1 of the first semiconductor chip 100 and a first surface 120_1 of the second dummy chip 120 may be disposed to oppose or face each other.

The first semiconductor chip 100 and the second semiconductor chip 200 may be bonded to each other through a first bonding pad 410, the first semiconductor chip 100 and the first dummy chip 110 may be bonded to each other through a second bonding pad 420, and the first semiconductor chip 100 and the second dummy chip 120 may be bonded to each other through a third bonding pad 430.

According to this embodiment, when a grinding process is performed on each of the chips as will be described below, the surfaces of each of the chips may be all formed of silicon (Si). Accordingly, damage to the chip surface to be ground may be minimized.

Figure 6:
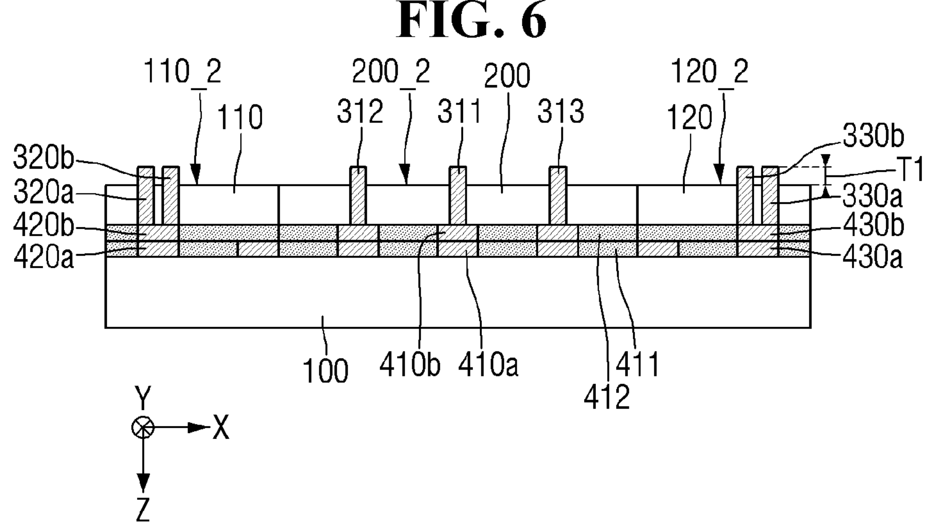

Referring to FIG. 6, the second semiconductor chip 200, the first dummy chip 110, and the second dummy chip 120 may be ground by a predetermined thickness T1 in the third direction Z to expose portions of the first to third through vias 310, 320, and 330, respectively. Upper surfaces 200_2, 110_2, and 120_2 of the second semiconductor chip 200, the first dummy chip 100, and the second dummy chip 120 may be formed to have a predetermined thickness by the above grinding process.

According to this embodiment, not only a portion of the second semiconductor chip 200, but also a portion of the first dummy chip 110 and a portion of the second dummy chip 120 are removed, so that the distribution of shapes and thicknesses of the respective chips can be easily adjusted.

Figure 7:
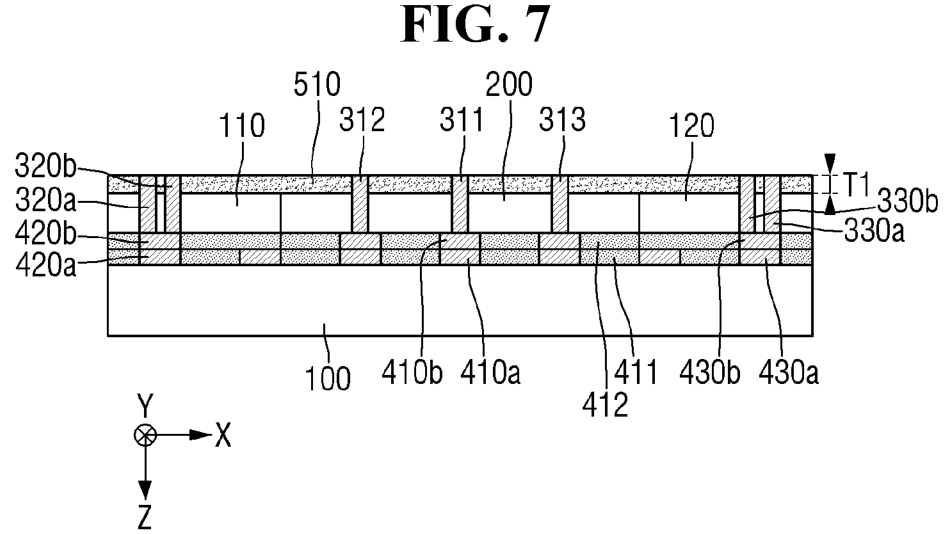

Referring to FIG. 7, a first insulating layer 510 may be integrally formed on the ground second semiconductor chip 200, the ground first dummy chip 110, and the ground second dummy chip 120. The first insulating layer 510 may include, for example, TEOS. The first insulating layer 510 may be stacked to the thickness T1, by which the second semiconductor chip 200, the first dummy chip 110, and the second dummy chip 120 are removed, or more.

According to this embodiment, since the second semiconductor chip 200, the first dummy chip 110, and the second dummy chip 120 are removed only to the extent that the first to third through vias 310, 320, and 330 are exposed, a thickness to which the first insulating layer 510 is stacked may be reduced compared to a conventional insulating layer. As a result, time and costs required for the process may be reduced.

Then, the first insulating layer 510 may be planarized such that an upper surface thereof is disposed coplanar with the upper surfaces of the exposed first to third through vias 310, 320, and 330. The planarization process may be performed, for example, by chemical mechanical polishing (CMP).

As described above, since the thickness to which the first insulating layer 510 is stacked can be reduced, time and costs required for the planarization process of removing a portion of the first insulating layer 510 may be reduced.

Figure 8:
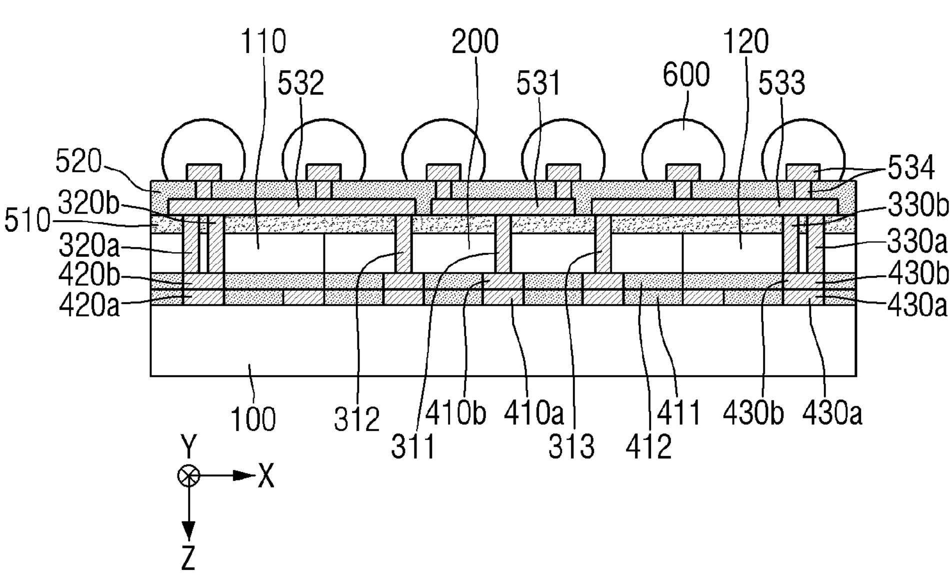

Referring to FIG. 8, a first substrate 500 including first to third connection pads 531, 532, and 533, a plurality of pads 534, and a second insulating layer 520 may be formed on the first insulating layer 510. A plurality of connection terminals 600 may be formed on the first substrate 500.

Although not specifically illustrated, the stack structure of the first semiconductor chip 100, the second semiconductor chip 200, the first and second dummy chips 110 and 120, the first insulating layer 510, the first substrate 500, and the first connection terminals 600 may be singulated into one structure to obtain the structure as shown in FIG. 8.

Then, an underfill material 610 and a mold layer 700 may be formed on the above-described structure of FIG. 8, and a second substrate 800 electrically connected to the first connection terminals 600 and second connection terminals 900 may be further formed. Thereafter, the semiconductor package 1000A shown in FIG. 4 may be formed.

The semiconductor package 1000A may be electrically connected to a main board or the like of an electronic device through the second connection terminals 900.

FIGS. 9 to 12 are views for describing a method of fabricating a semiconductor package according to some embodiments. For convenience of description, repeated contents of parts described with reference to FIGS. 1 to 8 may be omitted.

Figure 9:
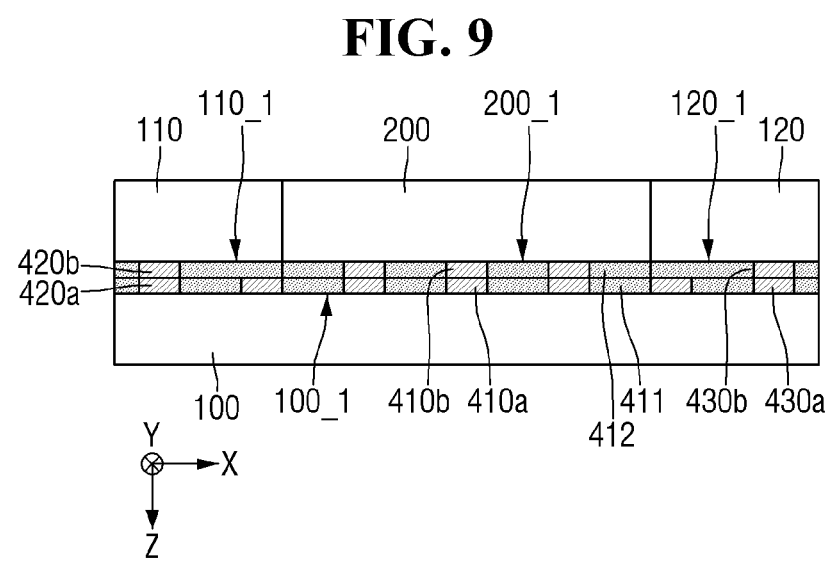

Referring to FIG. 9, a second semiconductor chip 200, a first dummy chip 110, and a second dummy chip 120, in each of which a through via is not formed, may be provided on a first semiconductor chip 100.

A first surface 100_1 of the first semiconductor chip 100 and a first surface 200_1 of the second semiconductor chip 200 may be disposed to oppose or face each other. The first surface 100_1 of the first semiconductor chip 100 and a first surface 110_1 of the first dummy chip 110 may be disposed to oppose or face each other. The first surface 100_1 of the first semiconductor chip 100 and a first surface 120_1 of the second dummy chip 120 may be disposed to oppose or face each other.

The first semiconductor chip 100 and the second semiconductor chip 200 may be bonded to each other through a first bonding pad 410, the first semiconductor chip 100 and the first dummy chip 110 may be bonded to each other through a second bonding pad 420, and the first semiconductor chip 100 and the second dummy chip 120 may be bonded to each other through a third bonding pad 430.

Figure 10:
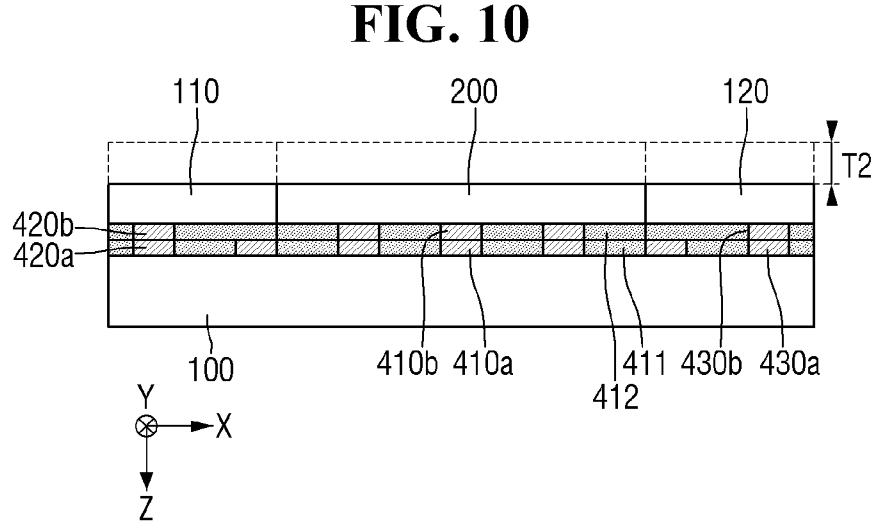

Referring to FIG. 10, upper surfaces of the second semiconductor chip 200, the first dummy chip 110, and the second dummy chip 120 may be ground by a predetermined thickness T2 in the third direction Z.

Figure 11:
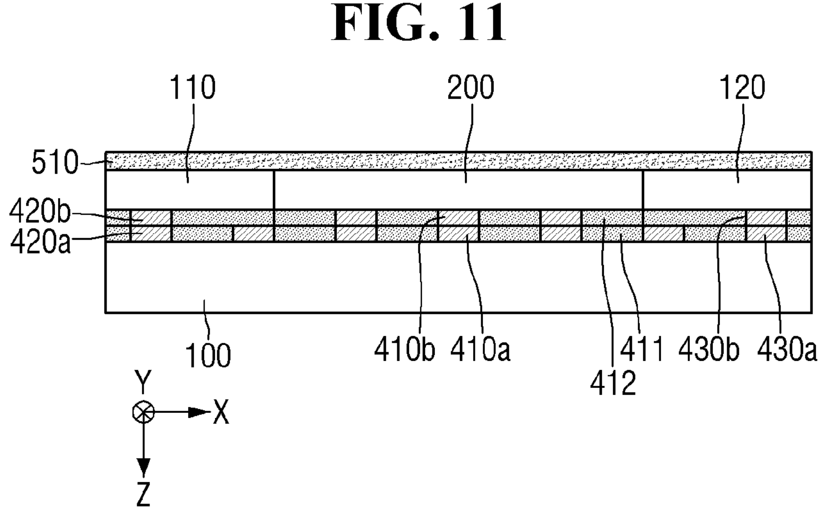

Referring to FIG. 11, a first insulating layer 510 may be integrally formed on the ground second semiconductor chip 200, the ground first dummy chip 110, and the ground second dummy chip 120. The first insulating layer 510 may include, for example, TEOS.

Figure 12:
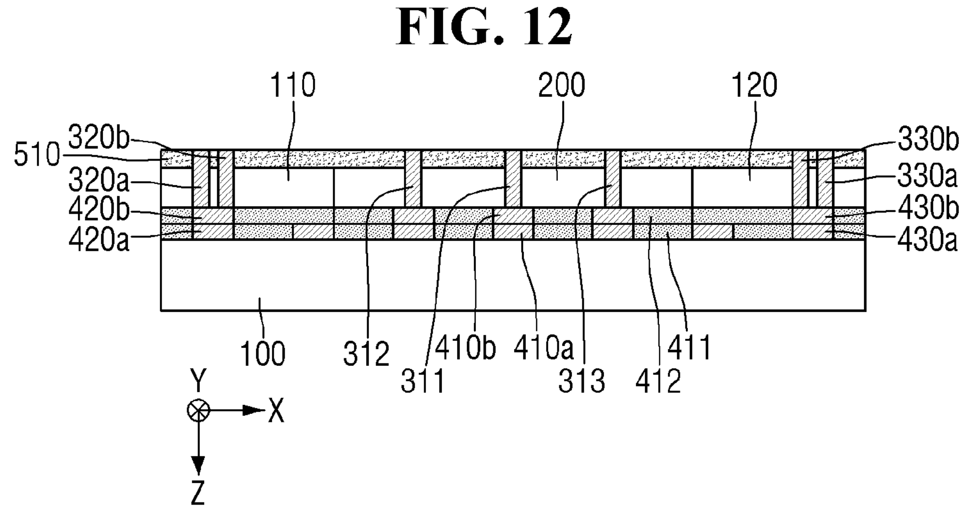

Referring to FIG. 12, first to third through vias 310, 320, and 330 may be formed to penetrate the first insulating layer 510, the second semiconductor chip 200, the first dummy chip 110, and the second dummy chip 120. A plurality of first to third through vias 310, 320, and 330 may be provided.

The first through via 310 may integrally penetrate the second semiconductor chip 200 and the first insulating layer 510, the second through via 320 may integrally penetrate the first dummy chip 110 and the first insulating layer 510, and the third through via 330 may integrally penetrate the second dummy chip 120 and the first insulating layer 510.

While the present disclosure has been particularly shown and described with reference to embodiments thereof and using specific terms, these embodiments are provided so that this disclosure will fully convey the concept of the present disclosure, and not for purposes of limitation. Thus, it will be obvious to one of ordinary skill in the art that various changes and other equivalents may be made therein. Therefore, the scope of the present disclosure is defined not by the detailed description of the present disclosure but by the appended claims.

What is claimed:

1. A semiconductor package comprising:

a first semiconductor chip;

first and second dummy chips below the first semiconductor chip;

a second semiconductor chip between the first and second dummy chips;

a first through via penetrating the second semiconductor chip and electrically connected to the first semiconductor chip;

second and third through vias penetrating the first and second dummy chips, respectively, and each electrically connected to the first semiconductor chip;

a first bonding pad bonding the first semiconductor chip to the second semiconductor chip;

a second bonding pad bonding the first semiconductor chip to the first dummy chip;

a third bonding pad bonding the first semiconductor chip to the second dummy chip; and a first insulating layer below the second semiconductor chip and below the first and second dummy chips with each of the first, second, and third through vias penetrating the first insulating layer.

2. The semiconductor package of claim 1, wherein the first bonding pad includes a first upper bonding pad on a lower surface of the first semiconductor chip and a first lower bonding pad on an upper surface of the second semiconductor chip, the second bonding pad includes a second upper bonding pad on the lower surface of the first semiconductor chip and a second lower bonding pad on an upper surface of the first dummy chip, the third bonding pad includes a third upper bonding pad on the lower surface of the first semiconductor chip and a third lower bonding pad on an upper surface of the second dummy chip, the first upper bonding pad and the first lower bonding pad are directly bonded to each other, the second upper bonding pad and the second lower bonding pad are directly bonded to each other, and the third upper bonding pad and the third lower bonding pad are directly bonded to each other.

3. The semiconductor package of claim 2, further comprising:

a second insulating layer below the first insulating layer with first, second, and third connection pads disposed therein; and a plurality of first connection terminals below the second insulating layer, wherein the first through via is positioned between the first lower bonding pad and the first connection pad to penetrate the second semiconductor chip and the first insulating layer, is electrically connected to the first semiconductor chip through the first upper bonding pad and the first lower bonding pad, and is electrically connected to at least one of the plurality of first connection terminals through the first connection pad.

4. The semiconductor package of claim 3, wherein the second through via is positioned between the second lower bonding pad and the second connection pad to penetrate the first dummy chip and the first insulating layer, and is electrically connected to the first semiconductor chip through the second upper bonding pad and the second lower bonding pad, and the third through via is positioned between the third lower bonding pad and the third connection pad to penetrate the second dummy chip and the first insulating layer, and is electrically connected to the first semiconductor chip through the third upper bonding pad and the third lower bonding pad.

5. The semiconductor package of claim 3, wherein the second through via is electrically connected to at least one of the plurality of first connection terminals through the second connection pad and the third through via is electrically connected to at least one of the plurality of first connection terminals through the third connection pad.

6. The semiconductor package of claim 1, wherein a first side surface of the second semiconductor chip is in contact with a side surface of the first dummy chip and a second, opposite side surface of the second semiconductor chip is in contact with a side surface of the second dummy chip.

7. The semiconductor package of claim 1, wherein an insulating material is not interposed between the second semiconductor chip and the first dummy chip and between the second semiconductor chip and the second dummy chip.

8. The semiconductor package of claim 1, wherein the first semiconductor chip extends in a first direction and a second direction that is perpendicular to the first direction, the first and second dummy chip are disposed below the first semiconductor chip in a third direction that is perpendicular to the first and second directions, and a side surface of the first dummy chip and a side surface of the second dummy chip are aligned to each side of the first semiconductor chip in the third direction.

9. The semiconductor package of claim 8, wherein with respect to the first and second directions, a size of the first semiconductor chip is greater than a size of the second semiconductor chip.

10. The semiconductor package of claim 1, wherein the first semiconductor chip is a logic chip and the second semiconductor chip is a memory chip.

11. The semiconductor package of claim 1, wherein the first and second dummy chips include silicon (Si).

12. A semiconductor package comprising:

a first semiconductor chip;

first and second dummy chips below the first semiconductor chip;

a second semiconductor chip between the first and second dummy chips;

a first through via extending into the second semiconductor chip and electrically connected to the first semiconductor chip;

second and third through vias extending into the first and second dummy chips, respectively, and each electrically connected to the first semiconductor chip;

a first bonding pad bonding the first semiconductor chip to the second semiconductor chip;

a second bonding pad bonding the first semiconductor chip to the first dummy chip; and a third bonding pad bonding the first semiconductor chip to the second dummy chip, wherein interfaces between the second semiconductor chip and each of the first and second dummy chips are free of an insulating material.

13. The semiconductor package of claim 12, wherein a first side surface of the second semiconductor chip is in contact with a side surface of the first dummy chip and a second, opposite side surface of the second semiconductor chip is in contact with a side surface of the second dummy chip.

14. The semiconductor package of claim 12, wherein:

the first bonding pad includes a first upper bonding pad on a lower surface of the first semiconductor chip and a first lower bonding pad on an upper surface of the second semiconductor chip and bonded to the first upper bonding pad, the second bonding pad includes a second upper bonding pad on the lower surface of the first semiconductor chip and a second lower bonding pad on an upper surface of the first dummy chip and bonded to the second upper bonding pad, and the third bonding pad includes a third upper bonding pad on the lower surface of the first semiconductor chip and a third lower bonding pad on an upper surface of the second dummy chip and bonded to the third upper bonding pad.

15. The semiconductor package of claim 14, further comprising:

a first insulating layer below the second semiconductor chip and below the first and second dummy chips and penetrated by each of the first, second, and third through vias;

a second insulating layer below the first insulating layer and having first, second, and third connection pads disposed therein; and a plurality of first connection terminals below the second insulating layer.

16. The semiconductor package of claim 15, wherein the first through via is electrically connected to the first semiconductor chip through the first upper bonding pad and the first lower bonding pad, the second through via is electrically connected to the first semiconductor chip through the second upper bonding pad and the second lower bonding pad, the third through via is electrically connected to the first semiconductor chip through the third upper bonding pad and the third lower bonding pad, the first through via is electrically connected to at least one of the plurality of first connection terminals through the first connection pad, the second through via is electrically connected to at least one of the plurality of first connection terminals through the second connection pad, and the third through via is electrically connected to at least one of the plurality of first connection terminals through the third connection pad.

* * * * *